US007885302B2

(12) United States Patent
Eberhard et al.

(10) Patent No.: US 7,885,302 B2
(45) Date of Patent: Feb. 8, 2011

(54) INTEGRATED TAPERED DIODE LASER ARRANGEMENT AND METHOD FOR PRODUCING IT

(75) Inventors: Franz Eberhard, Regensburg (DE); Thomas Schlereth, Würzburg (DE); Wolfgang Schmid, Deuerling/Hillohe (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 154 days.

(21) Appl. No.: 12/072,761

(22) Filed: Feb. 27, 2008

(65) Prior Publication Data
US 2008/0212632 A1    Sep. 4, 2008

(30) Foreign Application Priority Data
Feb. 28, 2007  (DE) .................. 10 2007 009 837
Jun. 12, 2007  (DE) .................. 10 2007 026 925

(51) Int. Cl.
*H01S 3/04*   (2006.01)
*H01S 5/00*   (2006.01)
(52) U.S. Cl. .................. 372/43.01; 372/39; 372/46.01
(58) Field of Classification Search ............ 372/39, 372/43.01, 46.01
See application file for complete search history.

(56) References Cited

U.S. PATENT DOCUMENTS

| | | | |
|---|---|---|---|
| 4,870,652 A | 9/1989 | Thornton | |
| 5,228,049 A | 7/1993 | Paoli | |
| 5,386,428 A | 1/1995 | Thornton et al. | |
| 6,174,748 B1 * | 1/2001 | Jeon et al. | 438/31 |
| 6,826,220 B2 * | 11/2004 | Balsamo et al. | 372/50.1 |
| 2002/0003918 A1 | 1/2002 | Ooi et al. | |
| 2002/0097762 A1 * | 7/2002 | Marsh et al. | 372/46 |
| 2003/0112842 A1 * | 6/2003 | Crawford | 372/46 |
| 2003/0141511 A1 * | 7/2003 | Marsh et al. | 257/98 |
| 2005/0230722 A1 | 10/2005 | Najda | |
| 2007/0077017 A1 * | 4/2007 | Menon et al. | 385/129 |
| 2007/0298531 A1 * | 12/2007 | Najda | 438/47 |

OTHER PUBLICATIONS

J. Marsh, "Intermixing Drives Photonic Integration (Fiber-Optic Components)", Compound Semiconducor, vol. 7; (http://compoundsemiconductor.net/articles/magazine/7/9/41/1), Sep. 2001.
B. Sumbf, et al., "735-nm tapered diode lasers with nearly diffraction-limited beam properties at P=2 W", electronic letters, vol. 38, 2002, pp. 183-184.

* cited by examiner

*Primary Examiner*—Minsun Harvey
*Assistant Examiner*—Phillip Nguyen
(74) *Attorney, Agent, or Firm*—Cohen Pontani Lieberman & Pavane LLP

(57) ABSTRACT

An integrated tapered diode laser arrangement comprises an injector region (2) and a region (3) which is optically coupled to the injector region and expands in a cross section. At least one of said regions (2, 3) has a quantum well structure with a plurality of semiconductor materials, wherein the semiconductor materials are intermixed at least in one region (21, 31). The intermixed region (21, 31) has a larger electrical band gap than a non-intermixed region.

29 Claims, 3 Drawing Sheets

INTEGRATED TAPERED DIODE LASER ARRANGEMENT AND METHOD FOR PRODUCING IT

RELATED APPLICATIONS

This patent application claims the priority of German patent applications 10 2007 009 837.7 filed Feb. 28, 2007 and 10 2007 026 925.2 filed Jun. 12, 2007, the disclosure content of both of which is herby incorporated by reference.

FIELD OF THE INVENTION

The present invention relates to an integrated semiconductor laser device, and to a method for producing it.

BACKGROUND OF THE INVENTION

Particularly high output powers in conjunction with good beam quality can be achieved with so-called tapered diode lasers. These semiconductor lasers have an amplifying region which widens laterally in the emission direction, and can generate, for example, infrared laser radiation with a radiation power in the watts range. A laser of this type is described, for example, in Sumpf et al., "735-nm Tapered Diode Lasers with Nearly Diffraction-Limited Beam Properties at P=2 W", Electron. Lett. 38, 2002, pp. 183-184.

Tapered diode lasers normally comprise an injector region and a trapezoidal region adjacent thereto. The trapezoidal region has a trapezoidally expanding cross section proceeding from the injector region. If a light wave propagates in the direction of the trapezoidal region proceeding from the injector region, then the wavefront is diffracted at the transition between these two regions. The wave is amplified in the trapezoidal region. Reflective boundary surfaces of the tapered diode laser arrangement can be coated in such a way that the resulting feedback suffices to initiate the self-oscillation.

A facet provided at the injector region can have a more highly reflective coating, while an exit facet at an end of the expanding region which is remote from the injector region has a lower reflectivity.

Tapered diode lasers are distinguished in particular by the comparatively high optical output power in conjunction with good beam quality.

SUMMARY OF THE INVENTION

It is an object of the present invention to provide an integrated tapered diode laser arrangement and a method for producing it which permit greater flexibility in setting the optical properties of the tapered diode laser.

This and other objects are attained in accordance with one aspect of the invention directed to an integrated tapered diode laser arrangement comprises an injector region and a region which is optically coupled to the injector region and expands in a cross section. At least one of said regions comprises at least partly an active zone having a plurality of semiconductor materials, wherein the semiconductor materials are intermixed at least in one region. The electronic band gap is increased in the at least one intermixed region.

The active zone or active structure having a plurality of semiconductor materials can comprise a quantum well structure with a plurality of semiconductor materials. However, the invention is not limited to a quantum well structure, but rather is also applicable to other structures, for example double heterostructures.

A semiconductor laser having an amplifying region with a width that increases in a main emission direction is referred to herein as a "tapered diode laser." Lasers of this type can be manufactured cost-effectively by means of standard production methods of semiconductor technology and additionally have an advantageously high output power and also a high beam quality.

In the context of the description set forth herein, the designation "quantum well structure" encompasses in particular any structure in which charge carriers can experience a quantization of their energy states by confinement. In particular, the designation "quantum well structure" does not comprise any indication about the dimensionality of the quantization. It therefore encompasses, inter alia, quantum wells, quantum wires, quantum films and quantum dots with any combination of these structures. So-called quantum dashes, quantum dots extended in a preferred direction, are also encompassed in the present case.

The intermixing enables overall a local change in the band gap, whereby regions in which the band gap is higher than in the surrounding material can be defined in an exact and at the same time simple manner. This can be utilized for flexible simultaneous production of different optically active and passive regions.

The increased (in comparison with non-intermixed regions) electronic band gap of the intermixed regions of the quantum well structure can have a positive effect on the brilliance, for example beam quality and maximum output power, of the laser from multiple standpoints. Firstly, the reabsorption of radiation which is emitted in the quantum well structure and, on the way to its being coupled out, passes through the intermixed regions of the quantum well structure is reduced since the energy of said radiation is smaller than the electronic band gap of the intermixed regions. Furthermore, the efficiency of the laser can be increased by electronic charge carriers preferably moving into regions having a smaller band gap, thereby increasing the number of charge carriers in those regions of the quantum well structure which are provided for generating radiation, and therefore also the number of radiative recombinations.

The injector region preferably comprises a monomode waveguide region.

The expanding region is preferably formed in trapezoidal fashion. In this case, the narrower of the two parallel sides of the trapezoid can be connected in an optical coupling to the injector region. The longer of the two parallel sides of the trapezoid is preferably formed as an exit surface. In one embodiment, the trapezoidal form arises in the case of a plan view of the integrated tapered diode laser arrangement.

In one embodiment, the expanding region directly adjoins the injector region. In this case, the expanding region can have a cross section that expands proceeding from the cross section of the injector region in a main radiation direction.

An exit facet can be provided at an end of the expanding region which is remote from the injector region.

A highly reflective facet can be provided at an end of the injector region which is remote from the expanding region.

The reflectivity of the exit facet is preferably lower than that of the highly reflective facet.

The highly reflective facet and/or the exit facet can comprise a non-absorbing mirror region formed as an intermixed region. Non-absorbing mirror regions are also referred to as NAM, non-absorbing mirrors.

The targeted intermixing of facet regions leads to an increase in the band gap and thus to a reduction of the absorption in said regions. Furthermore, the intermixed regions no longer contribute to the laser activity. The thermal loading of the facets therefore decreases, which in turn enables higher output powers of the laser.

In one embodiment, a free propagation region is provided between the expanding region and the injector region. The free propagation region has a reduced amplification by comparison with the expanding region and is formed as an intermixed region. The free propagation region is preferably formed as a non-absorbing region.

An intermixed free propagation region having an increased band gap represents an optically passive region. This holds true even when a metallization is continuously connected. Absorption and amplification are therefore greatly suppressed in the free propagation region, whereby the mode structure of a radiation injected from the injector region into the amplifying expanding region is not disturbed. Consequently, the free propagation region results in an improved beam quality.

The expanding region can comprise at least one edge region which extends in a direction from the injector region to an end of the expanding region, wherein the at least one edge region is formed as an intermixed region.

As a result of targeted influencing of the band gap in the expanding region, the local gain can be adapted to the mode profile in said region. As a result, the beam quality is increased overall. What can be achieved in this case is that a maximum of a spectral gain is shifted toward shorter wavelengths. Radiation from the injector region is amplified to a lesser extent in said intermixed regions. What can be achieved on the other hand is that, owing to the higher band gap, the intermixed regions are electrically pumped to a lesser extent.

In one embodiment, the injector region comprises at least one injector edge region which extends in a direction from the expanding region to an end of the injector region, wherein the at least one injector edge region is formed as an intermixed region.

The production of regions having an increased band gap enables a particularly fine definition of a monomode injector. Compared with an etching method that is possible as an alternative, the principle proposed has the advantage that the entire structure is planar. Further processing is, therefore, significantly simplified.

In another embodiment, the entire injector region and the entire expanding region of the tapered diode laser arrangement are formed as an intermixed region.

What can be achieved by the intermixing of the entire tapered diode laser structure is that the surrounding material has a lower band gap than the laser itself. As a result, light which laterally leaves the expanding region after a back-reflection at the exit facet can be absorbed very effectively and is not reflected back into the injector.

Overall, it is thus possible to realize absorber structures in regions surrounding the tapered diode laser.

In addition to the advantage of greater flexibility in the production of different optically active and passive regions, the principle proposed affords the advantage in all the embodiments that many relatively complex process steps such as, for example, oxidation, etching, patterning of contacts etc. can be replaced by a technologically simpler process step.

A combination of the embodiments proposed can also be realized overall by means of just one process step.

The production of the intermixed region or regions of the quantum well structure is preferably effected by means of a diffusion-induced intermixing process (DID).

Such a production method is known for example by the abbreviation QWI, quantum well intermixing.

In the present case, a diffusion-induced intermixing process encompasses for example a method in which, after the production of a quantum well structure, a layer is applied to the regions provided for intermixing, wherein one of the components of the semiconductor material of the quantum well structure has a preferred diffusion movement in the direction of said layer at a suitably high temperature. The applied layer can contain silicon nitride, for example. The diffusion movement is initiated by a heat treatment step at a correspondingly high temperature. The diffusion movement produces vacancies at the surface of the quantum well structure. The vacancies thus produced diffuse further within the quantum well structure, whereby an intermixing of the quantum well structure is brought about.

Other methods of diffusion-induced intermixing comprise a diffusion of impurity atoms which pass into the semiconductor by means of implantation or by diffusion from suitable layers. Layers of this type can be introduced as early as during the production of a III-V material, or be applied subsequently.

Besides the above-described diffusion-induced intermixing by so-called impurity free vacancy disordering, IFVD, it is therefore also possible to use other methods such as, for example, impurity induced disordering, laser induced disordering, implantation induced disordering, etc.

The semiconductor materials of the quantum well structure are for example a III-V semiconductor, in particular a III-V semiconductor comprising gallium. The applied layer can be for example a silicon nitride layer. The method described has the advantage of a comparatively simple process implantation and thus comparatively low costs.

Particularly in the case of diffusion-induced intermixing by means of impurity free vacancy disordering, IFVD, the applied layer can contain silicon oxide, SiO.

DETAILED DESCRIPTION OF THE DRAWINGS

In the description of the exemplary embodiments, identical or identically acting elements in the figures are shown with the same reference symbols.

Figure 1:
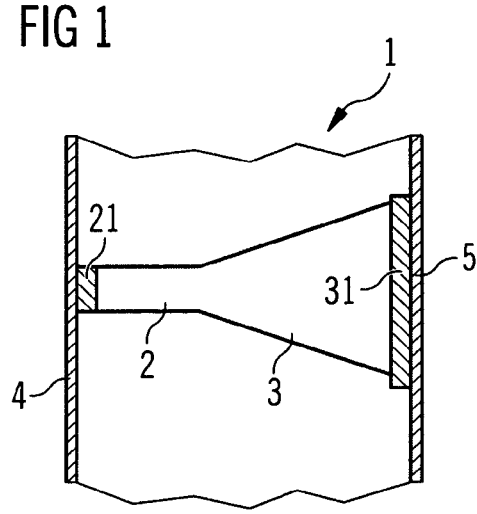
FIG. 1 shows a schematically illustrated section through a first exemplary embodiment of a tapered diode laser arrangement according to the invention.

In the exemplary embodiment of a tapered diode laser arrangement shown in FIG. 1, a region 3 which expands trapezoidally in cross section is directly adjacent to an injector region 2. The injector region 2 is terminated by a highly reflective facet 4 at an end remote from the expanding region 3. By contrast, the expanding region 3 is terminated by an exit facet 5 at the end remote from the injector region 2. The highly reflective facet 4, in the same way as the exit facet 5, respectively comprise a non-absorbing mirror region 21, 31, which are realized as a diffusion-induced intermixing region. Accordingly, in the non-absorbing mirror regions 21, 31, the electronic band gap is increased by comparison with the injector region 2 and the expanding region 3.

This targeted intermixing in the facet regions leads to a reduction of the absorption in said regions of radiation generated outside the regions 21, 31. Therefore, said regions 21, 31 do not contribute to the laser activity, i.e. the generation of laser radiation. This in turn leads to a reduced thermal loading at the facets 4, 5 which overall enables a higher maximum output power of the laser 1 from FIG. 1.

Figure 2:
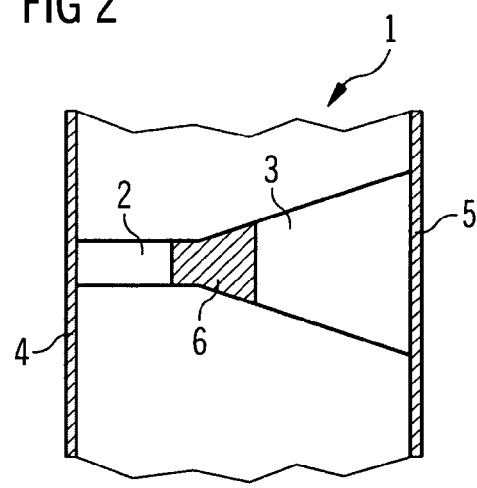
FIG. 2 shows a schematically illustrated section through a second exemplary embodiment of a tapered diode laser arrangement according to the invention.

In the embodiment in accordance with FIG. 2, an additional free propagation region 6 is provided between the injector region 2 and the expanding region 3. The free propagation region 6 is formed as a diffusion-induced intermixing region and is, therefore, provided with an increased band gap by comparison with the injector and expanding regions 2, 3. The intermixed free propagation region 6, therefore, represents an optically passive region. Absorption and amplification are greatly suppressed in said region. As a result, the mode structure of the radiation injected into the trapezoidal region is not disturbed in an undesirable manner.

Figure 3:
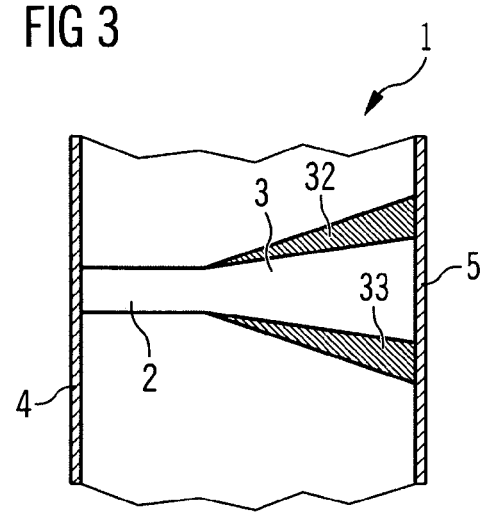
FIG. 3 shows a schematically illustrated section through a third exemplary embodiment of a tapered diode laser arrangement according to the invention.

FIG. 3 shows an exemplary embodiment in which intermixed regions are provided in injector edge regions 32, 33 within expanding region 3 and along those sides of the tapered diode laser arrangement which extend away from the injector region 2 as far as an end of the expanding region 3 which is remote from the injector region 2, in the present case as far as the exit facet 5. In this case, the intermixed regions of injector edge regions 32, 33 themselves have, proceeding from the injector region 2, an increasing cross section in the direction of the exit facet 5.

By means of the intermixing of specific regions in the expanding region, the amplification to the profile of the desired mode of the radiation can be adapted. In this case, the maximum of the spectral gain is shifted toward shorter wavelengths. The radiation is, therefore, amplified to a lesser extent in the intermixed regions 32, 33 than in the remaining expanding region 3. On account of their higher band gap, the edge regions 32, 33 are electrically pumped to a lesser extent.

In the edge regions 32, 33, the sharpness of the transitions in the quantum well is altered, such that an altered gain spectrum results. Further details are provided below with regard to FIG. 7.

In alternative embodiments, the edge regions 32, 33 can extend over significantly larger regions. By way of example, the entire chip with the exception of a remaining injector region 2 and a remaining expanding region 3 could be intermixed.

Figure 4:
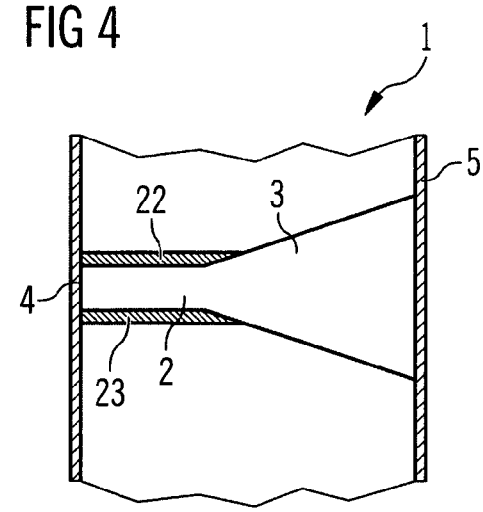
FIG. 4 shows a schematically illustrated section through a fourth exemplary embodiment of a tapered diode laser arrangement according to the invention.

FIG. 4 shows a tapered diode laser arrangement in which injector edge regions 22, 23 of the waveguide are formed as intermixed regions in the injector region 2. In the example shown, these injector edge regions 22, 23 extend essentially parallel to one another and from the highly reflective facet 4 as far as the transition from the injector region 2 to the expanding region 3.

By intermixing the quantum film in the injector edge regions 22, 23, this results in a reduced refractive index and, thus, a waveguide structure. The suitable arrangement of intermixed and non-intermixed regions thus makes it possible, in a simple manner, to produce lateral monomode waveguide structures. By producing regions having an increased band gap 22, 23, it is therefore possible, in a simple manner, to define a monomode injector by means of diffusion-induced intermixing. Compared with other production methods such as oxidation or dry etching, the disclosed arrangement has the advantage that a planar structure is produced overall, which permits simpler further processing.

In alternative embodiments, the edge regions 22, 23 can extend over significantly larger regions. By way of example, the entire chip with the exception of a remaining injector region 2 and a remaining expanding region 3 could be intermixed.

Figure 5:
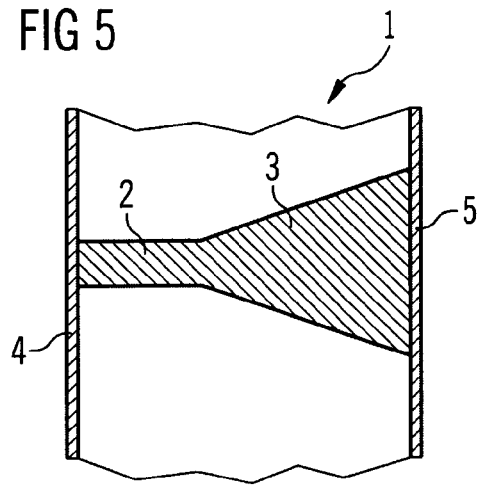
FIG. 5 shows a schematically illustrated section through a fifth exemplary embodiment of a tapered diode laser arrangement according to the invention.

FIG. 5 shows an exemplary embodiment of the invention in which not only (as in FIGS. 1 to 4) partial regions of the tapered diode laser are formed as intermixed regions, rather the entire tapered diode laser comprising the entire injector region and the entire expanding region are embodied as intermixed regions. The entire tapered diode laser 2, 3 comprising the injector region 2 and the expanding region 3 adjacent thereto is formed as a quantum well structure with a plurality of semiconductor materials, wherein the semiconductor materials are intermixed in the entire region 2, 3, and wherein this intermixed region has an increased electronic band gap.

The material surrounding the tapered diode laser structure, therefore, has a lower band gap than the laser comprising the injector region 2 and the expanding region 3 itself. Light which laterally leaves the expanding region after a back-reflection at the exit facet 5 formed as coupling-out mirror can, therefore, be absorbed very effectively and is not reflected back into the injector region 2.

The disclosed arrangement makes it unnecessary to provide deflector trenches (spoilers) or etching trenches coated with germanium.

What is common to all the embodiments shown in FIGS. 1-5 is that electrical contacts or metallization levels which may be required for the excitation of the laser are not depicted for reasons of better clarity.

Figure 6:
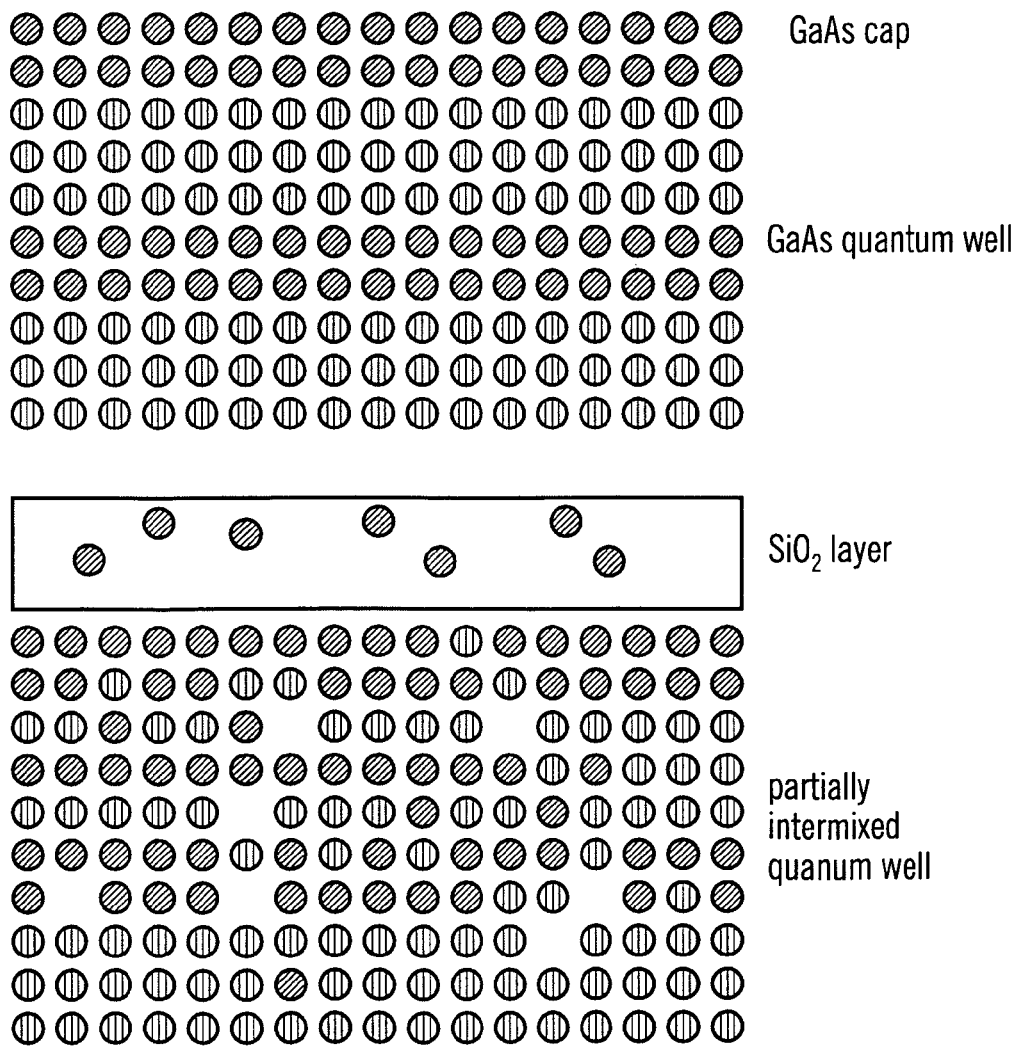
FIG. 6 shows a gallium arsenide/aluminum arsenide quantum well structure before and after a diffusion-induced intermixing.

FIG. 6 shows an example for producing a region with diffusion-induced intermixing, which is also referred to as QWI, quantum well intermixing. The process shown in said figure is also referred to as impurity free vacancy disordering, IFVD. In this case, a III-V semiconductor, in the present case a gallium arsenide/aluminum arsenide structure with a gallium arsenide cap and a gallium arsenide quantum well, is provided with a silicon dioxide, $SiO_2$ layer. A heat treatment step is carried out. At elevated temperatures, the gallium is soluble and has a high diffusion coefficient in the $SiO_2$. Therefore, some gallium atoms diffuse into the $SiO_2$ cap during the heat treatment. Vacancies are produced as a result of the fact that the gallium atoms leave the semiconductor. These vacancies themselves have a high diffusion coefficient in the semiconductor. The vacancies diffuse from a region having a high concentration at the surface to regions of lower concentration, namely in the remaining semiconductor region. In this case, individual vacancies follow a random movement pattern. The effect of this random movement pattern of a multiplicity of vacancies is that an intermixing results. Aluminum and gallium atoms are illustrated as differently hatched in FIG. 6.

Figure 7:
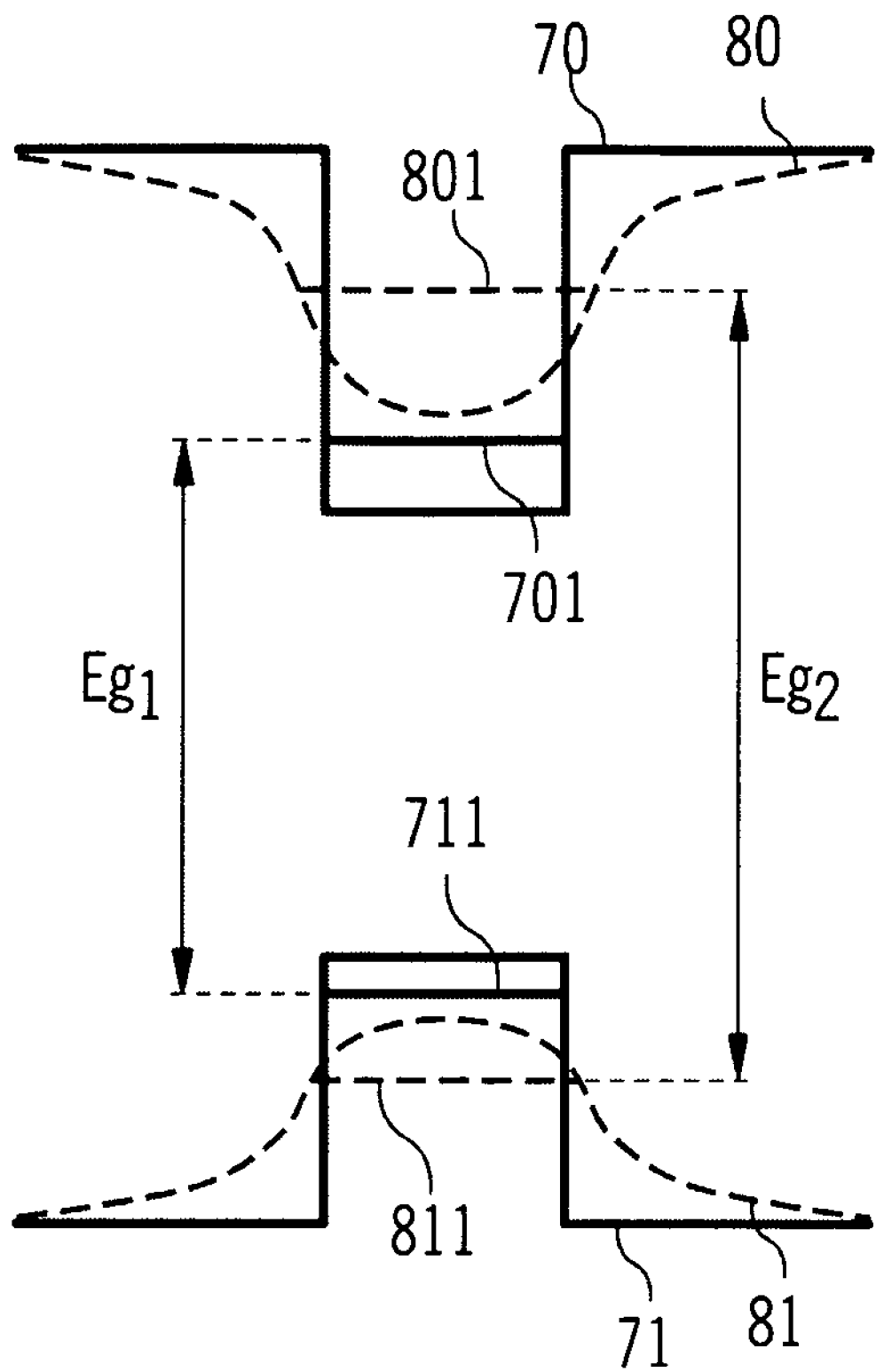
FIG. 7 shows the conduction and valence bands before and after the diffusion-induced intermixing.

The effects of the diffusion-induced intermixing are illustrated in FIG. 7 which depicts conduction and valence bands. As described in connection with FIG. 6, the gallium arsenide layer realizes a quantum well. The solid line 70 shows the conduction band and line 71 shows the valence band prior to the intermixing process. The conditions after intermixing has taken place are depicted by the dashed lines 80 and 81 for the conduction band and the valence band, respectively.

The levels of electrons and holes in the quantum well are quantized. Prior to the intermixing process, the effective band gap $E_{g1}$ is the difference between the ground state for electrons 701 and the ground state for the holes 711.

The diffusion-induced intermixing has the effect that aluminum diffuses into the well and gallium diffuses out of the well. This results in an extended width of the quantum well and also in an increased average band gap. This band gap is larger than that of conventional gallium arsenide realized in a quantum well.

Hence, by means of the intermixing, the effective band gap $E_{g2}$ that arises between the ground state for electrons 801 and the ground state for holes 811 is increased with respect to the band gap $E_{g1}$.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

We claim:

1. An integrated tapered diode laser arrangement, comprising:
    an injector region; and
    an expanding region which is optically coupled to the injector region and expands in a cross section in a main radiation direction, the expanding region being an amplifying region;
    wherein at least one of said injector region and said expanding region comprises an active region having a plurality of semiconductor materials intermixed at least in one intermixed region; and
    wherein the intermixed region has a larger electronic band gap than a non-intermixed region.

2. The tapered diode laser arrangement as claimed in claim 1, in which the injector region comprises a monomode waveguide region.

3. The tapered diode laser arrangement as claimed in claim 1, in which the expanding region is formed in trapezoidal fashion.

4. The tapered diode laser arrangement as claimed in claim 1, in which the expanding region directly adjoins the injector region and has a cross section that expands proceeding from a cross section of the injector region in the main radiation direction.

5. The tapered diode laser arrangement as claimed in claim 1, comprising an exit facet arranged at an end of the expanding region which is remote from the injector region.

6. The tapered diode laser arrangement as claimed in claim 1, comprising a highly reflective facet arranged at an end of the injector region which is remote from the expanding region.

7. The tapered diode laser arrangement as claimed in claim 5, comprising a highly reflective facet arranged at an end of the injector region which is remote from the expanding region, in which at least one of the highly reflective facet and the exit facet comprises a non-absorbing mirror region formed as the intermixed region.

8. The tapered diode laser arrangement as claimed in claim 1, further comprising a free propagation region with reduced amplification by comparison with the expanding region arranged between the injector region and the expanding region, the free propagation region being formed as the intermixed region.

9. The tapered diode laser arrangement as claimed in claim 1, in which the expanding region comprises at least one edge region which extends in a direction from the injector region to an end of the expanding region, wherein the at least one edge region is formed as the intermixed region.

10. The tapered diode laser arrangement as claimed in claim 1, in which the injector region comprises at least one injector edge region which extends in a direction from the expanding region to an end of the injector region, wherein the at least one injector edge region is formed as the intermixed region.

11. The tapered diode laser arrangement as claimed in claim 1, in which the entire injector region and the entire expanding region are formed as the intermixed region.

12. An integrated optical arrangement, comprising a trapezoidal region which expands in a cross section and which is produced at least partly using a diffusion-induced intermixing process.

13. The arrangement as claimed in claim 12, further comprising an exit facet arranged at an end of the trapezoidal region which expands in a cross section, in which the exit facet comprises a non-absorbing mirror region produced using a diffusion-induced intermixing process.

14. The arrangement as claimed in claim 12, in which the trapezoidal region which expands in a cross section comprises at least one edge region, wherein the edge region is produced using a diffusion-induced intermixing process.

15. A method for producing an integrated tapered diode laser arrangement, the method comprising:
    forming an injector region; and
    forming an expanding region which is optically coupled to the injector region and expands in a cross section in a main radiation direction, the expanding region being an amplifying region;
    in which at least one of the injector region and the expanding region comprises an active structure with a plurality of semiconductor materials intermixed at least in one intermixed region in order to increase the electronic band gap.

16. The method as claimed in claim 15, in which the at least one intermixed region is produced by means of a diffusion-induced intermixing process.

17. The method as claimed in claim 15, in which the active structure comprises a quantum well structure, and in which regions of the quantum well structure are intermixed by applying a layer and by a subsequent heat treatment step, the temperature of which is suitable for bringing about partial diffusion of a component of the semiconductor materials forming the quantum well structure into the applied layer.

18. The method as claimed in claim 17, in which the applied layer is an SiN layer.

19. The method as claimed in claim 17, in which the quantum well structure comprises a III-V semiconductor material.

20. The method as claimed in claim 19, in which the III-V semiconductor material comprises gallium.

21. The method as claimed in claim 15, further comprising forming at least one of a highly reflective facet at the injector region and an exit facet at an end of the expanding region which is remote from the injector region, an intermixing being effected at least partly during the formation of the at least one of a highly reflective facet and the exit facet.

22. The method as claimed in claim 15, further comprising forming a free propagation region between the injector region and the expanding region, wherein an intermixing is effected at least partly during the formation of the free propagation region.

23. The method as claimed in claim 15, in which an intermixing is carried out in an edge region of the expanding region, wherein the edge region extends in a direction from the injector region to an end of the expanding region which is remote from the injector region.

24. The method as claimed in claim 15, in which an intermixing is carried out in an injector edge region of the injector region, wherein the injector edge region extends in a direction from the expanding region to an end of the injector region which is remote from the expanding region.

25. The method as claimed in claim 15, in which an intermixing is effected in the entire injector region and in the entire expanding region.

26. The arrangement as claimed in claim 12, wherein the integrated optical arrangement is a tapered diode laser arrangement.

27. An integrated tapered diode laser arrangement, comprising:
   an injector region; and
   an expanding region optically coupled to the injector region and expanding in a cross section in a main radiation direction, the expanding region being an amplifying region;
   wherein the injector region and said expanding region comprise an active region having a plurality of semiconductor materials;
   wherein the injector region comprises two injector edge regions which extend parallel to one another and in a direction from the expanding region to an end of the injector region;
   wherein the semiconductor materials are intermixed in said injector edge regions forming intermixed regions, which have a reduced refractive index compared to a non-intermixed part of the injector region.

28. The tapered diode laser arrangement as claimed in claim 27, wherein the injector edge regions form a planar waveguide structure.

29. An integrated tapered diode laser arrangement, comprising:
   an injector region; and
   an expanding region optically coupled to the injector region and expanding in a cross section in a main radiation direction, the expanding region being an amplifying region;
   a free propagation region arranged between the injector region and the expanding region and having reduced amplification by comparison with the expanding region;
   wherein the free propagation region is formed as an intermixed region having a larger electronic band gap than that of the expanding region and having a larger band gap than that of the injector region.

* * * * *